United States Patent
Iyer

Patent Number: 6,039,851
Date of Patent: Mar. 21, 2000

[54] REACTIVE SPUTTER FACETING OF SILICON DIOXIDE TO ENHANCE GAP FILL OF SPACES BETWEEN METAL LINES

[75] Inventor: Ravi Iyer, Boise, Id.

[73] Assignee: Micron Technology, Inc., Boise, Id.

[21] Appl. No.: 09/006,729

[22] Filed: Jan. 14, 1998

Related U.S. Application Data

[63] Continuation of application No. 08/409,372, Mar. 22, 1995.

[51] Int. Cl.[7] .......................... C23C 14/34; H01L 21/465
[52] U.S. Cl. .................. 204/192.32; 204/192.35; 204/192.37; 438/697; 438/699
[58] Field of Search ............... 204/192.32, 192.37, 204/192.35; 438/697, 699

[56] References Cited

U.S. PATENT DOCUMENTS

| | | | |
|---|---|---|---|
| 4,714,520 | 12/1987 | Gwozdz | 438/699 |
| 4,793,897 | 12/1988 | Dunfield et al. | 204/192.37 |
| 4,872,947 | 10/1989 | Wang et al. | 204/192.37 |
| 4,904,341 | 2/1990 | Blaugher et al. | 204/192.37 |
| 4,948,458 | 8/1990 | Ogle | 204/192.32 |
| 5,021,121 | 6/1991 | Groechel et al. | 204/192.37 |
| 5,047,115 | 9/1991 | Charlet et al. | 204/192.37 |
| 5,124,014 | 6/1992 | Foo et al. | 204/192.37 |
| 5,162,261 | 11/1992 | Fuller et al. | 437/195 |
| 5,173,151 | 12/1992 | Namose | 438/699 |
| 5,270,264 | 12/1993 | Andideh et al. | 204/192.37 |
| 5,346,585 | 9/1994 | Doan et al. | 438/699 |
| 5,416,048 | 5/1995 | Blalock et al. | 204/192.32 |
| 5,426,076 | 6/1995 | Moghadam | 438/699 |
| 5,681,425 | 10/1997 | Chen | 438/697 |

*Primary Examiner*—Nam Nguyen
*Assistant Examiner*—Gregg Cantelmo

[57] ABSTRACT

An embodiment of the present invention teaches a semiconductor device fabrication process for reducing bread-loafing of an insulative layer at the gaps between a plurality of patterned conductive lines, by sputter faceting an existing $SiO_2$ layer overlying the patterned conductive lines by flowing in argon gas at a rate of approximately 50 sccm, with a reactive $CF_4$ gas having a flow rate range of approximately 1–4 sccm, into a chamber having a chamber pressure set at approximately 30 mTorr that is equipped with a magnetic field set at approximately 60 Gauss.

12 Claims, 2 Drawing Sheets

REACTIVE SPUTTER FACETING OF SILICON DIOXIDE TO ENHANCE GAP FILL OF SPACES BETWEEN METAL LINES

This application is a continuation to U.S. patent application Ser. No. 08/409,372, filed Mar. 22, 1995.

FIELD OF THE INVENTION

This invention relates to a semiconductor fabrication process and more particularly to a faceting process used during integrated circuit manufacturing.

BACKGROUND OF THE INVENTION

During semiconductor fabrication, currently, silicon dioxide ($SiO_2$) obtained from the plasma reaction of TEOS with oxygen ($O_2$), is used as the gap fill material between patterned metal lines. Unfortunately, growth of $SiO_2$ occurs with some bread-loafing at the top of the gap which tends to cause the top of the gap opening to close before the $SiO_2$ can completely fill the gap. Also, during normal sputter faceting, at the top edge of the gap the $SiO_2$ becomes angled but consequently the dislodged $SiO_2$ particles re-deposit directly below the angled edge and prematurely re-close the gap opening.

FIG. 2 depicts a typical in process wafer portion where patterned parallel lines 21 have been formed over substrate 20. An insulative layer 23 has been formed to coat patterned lines 21 and substrate 20. During deposition of layer 23 the deposited material tends to build up faster at the edges 24 of lines 21 than along the vertical walls of lines 21, thus resulting in bread-loafing. This bread-loafing at the edges 24 is problem in that any subsequent layer formed into the gaps 22 will not be able to sufficiently fill the gap before the gap opening is closed or "pinched off." Obviously, in most cases this is a highly undesirable condition as adequate isolation between lines 21 cannot be obtained.

Reliable in-situ techniques to reduce (if not eliminate) bread-loafing at the top edges of the gap opening prior to a filling the gaps with material are therefore required. The present invention provides such a technique, as will become apparent in the disclosure made hereinafter.

SUMMARY OF THE INVENTION

An embodiment of the present invention teaches a process for reducing undesirable material from a layer forming part of a semiconductor device, comprising removing at least a part of the undesirable material by using a faceting process which employs a reactive substance.

This embodiment is further enhanced by controlling the ratio of an inert gas to that of a reactive gas to determine the extent to which the edges are reduced or rounded.

DETAILED DESCRIPTION OF THE INVENTION

Figure 1:
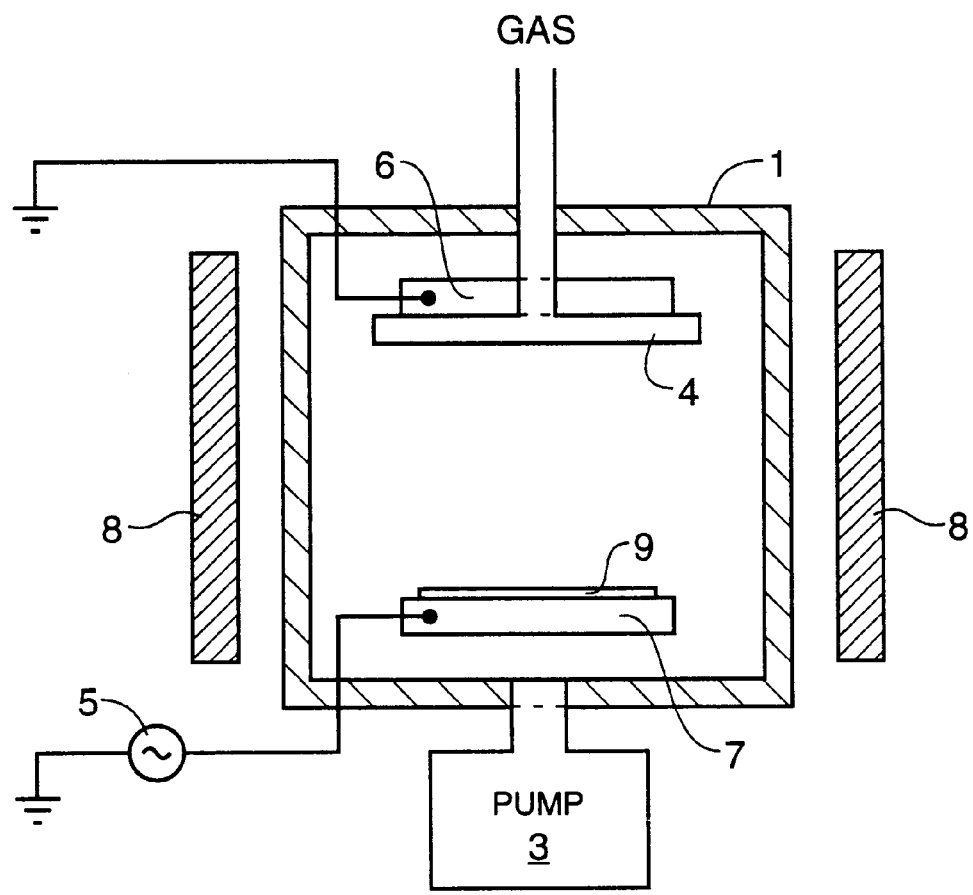
FIG. 1 represents a sputter deposition chamber used to practice the present invention.
Figure 3:
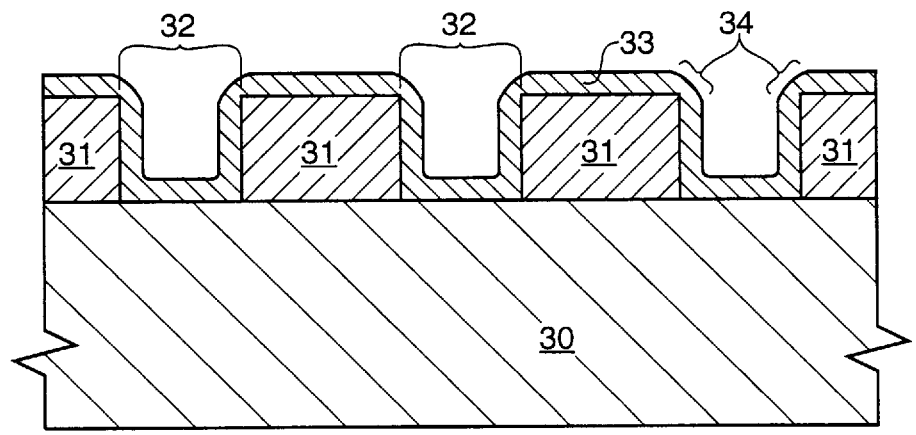
FIGS. 3 and 4 are cross-sectional views of an in process wafer portion depicting the present invention.
Figure 4:
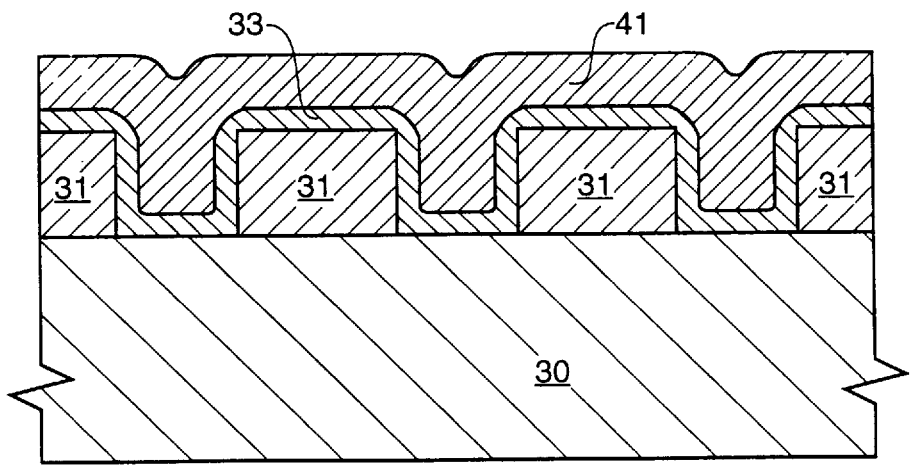

The present invention is depicted as a general embodiment in FIGS. 3 and 4. FIG. 1 shows an etching chamber that is conducive to performing the present invention.

Referring now to FIG. 1, chamber 1 is equipped with wafer mount 7, which holds wafer sample 9, pressure pump 3, shower head 4, plasma source 5 (including electrodes 6 and 7) and surrounding magnetic coils 8 (Note that wafer mount 7 doubles as electrode 7). Gases are delivered to the chamber via shower head 4 at a desired flow rate. In a capacitively coupled system as shown in FIG. 1, plasma power is supplied through radio frequency (rf) power supply 5. The chamber may also be equipped with an inductively coupled source to generate the plasma or a combination of both a capacitively coupled and inductively coupled plasma source. The chamber depicted in FIG. 1 is representative of a chamber that may be used to practice the present invention (though other chambers may work as well). Other chambers that will work includes high density plasma chambers which may also be equipped with either a capacitively coupled plasma source, an inductively coupled plasma source or a combination of both.

In an embodiment of the present invention and referring now to FIG. 3, a prepared wafer is presented inside a chamber, like that of FIG. 1, for faceting of existing layer 33 to reduce undesirable material from a layer that overlies a discontinuous surface. A discontinuous surface comprises any surfaces that do not exhibit the same topography. For example, patterned adjacent structures 31, separated by gaps 32, present various topography levels. Layer 33 overlies this discontinuous surface by conforming to adjacent structures 31 and surface of material 30 bridging the gaps therebetween. Layer 33 has undesirable material (sometimes referred to as bread-loaf buildup) and that has built up at locations 34. Reducing this bread-loafing will allow a material to fill gaps 32 between a plurality of adjacent structures 31. Adjacent structures 31 may be any adjacent structures (either insulative or conductive or a combination of both) that at some point have gaps in between. Also, substrate 30 may be either conductive of insulative but in the preferred embodiment substrate 30 is an insulative material.

As a specific embodiment, layer 33 is an insulative layer overlying patterned conductive lines 33. In this embodiment, the process comprises faceting (preferably a faceting process using an inert gas and more preferably a sputter faceting process) existing insulative layer 33 overlying patterned conductive lines 31 with the aid of a chemically reactive substance such as by flowing in a chemically reactive gas (hereinafter, reactive gas) during the faceting step. The reactive gas proves effective in shaping or reducing the bread-loafed edges 34. Particularly, reactive gases that comprise fluorine atoms or fluorinated hydrocarbons prove effective in reducing the bread-loafed edges 34.

It is preferred to flow in an inert gas with a reactive gas in that the ratio of the gases, in such a gas combination, may be varied to determine the desired shape of the corners as the corners are being reduced. Also, during the sputter faceting, atoms from the reactive gas prevent the dislodged particles of insulating layer 33 from re-sputtering into gaps 32.

Figure 2:
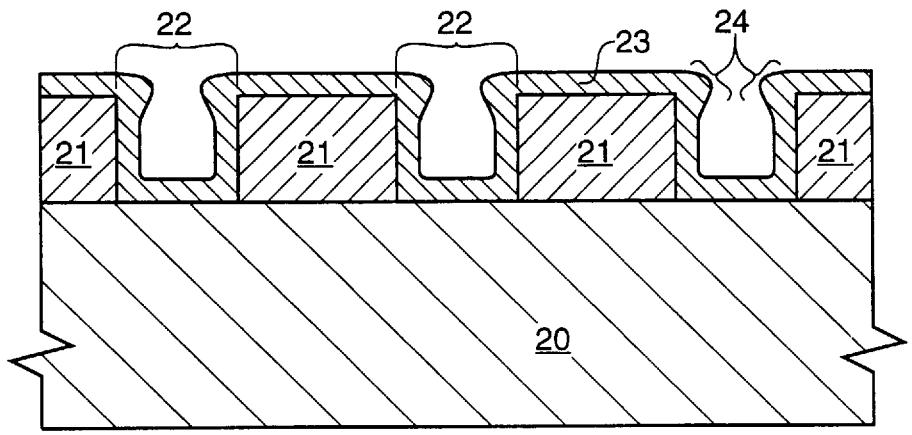
FIG. 2 is a cross-sectional view of an in process wafer portion depicting the bread-loafing phenomenon.

Referring now to FIG. 4, a gap fill material 41 is formed to fill gaps 32 (seen in FIG. 2) as the bread-loafing at edges 34 have been reduced or entirely eliminated. If the bread-loafing is completely eliminated it will allow gaps 32 to be completely filled if so desired.

As a specific embodiment for a semiconductor device fabrication process for filling the gaps between a plurality of patterned conductive lines (or for preventing bread-loafing therebetween), the process comprises sputter faceting an existing $SiO_2$ layer overlying the patterned conductive lines by flowing in argon gas at a rate of approximately 50 sccm, with a reactive $CF_4$ gas having a flow rate range of approximately 1–4 sccm, into a chamber having a chamber pressure set at approximately 30 mTorr that is equipped with a magnetic field set at approximately 60 Gauss. Similar results may be obtain by the use of $NF_3$ rather than $CF_4$. After the sputter faceting is completed a gap fill insulating material, such as silicon dioxide is deposited to fill the gaps (completely filling the gaps is preferred).

These parameters may be varied somewhat depending on the etch rate desired. For example, with only 2 sccm of $CF_4$ added to argon, the etch rate when compared to the etch rate of argon alone, is increased from 5 A/sec to 9.5 A/sec or the etch rate is increased to 14 A/sec with the addition of 4 sccm of $CF_4$. As a side benefit the $CF_4$ gas does not cause any noticeable contamination of the remaining oxide.

The processes mentioned above (both the general case and the specific examples) may be implemented during fabrication of a memory device and in particular a dynamic random access memory (DRAM) device. For example, the conductive lines may represent word lines or digit lines (conductively doped polysilicon) used to read and write a memory cell. The conductive lines may also represent conductive interconnects (usually metal) that connect power and ground to specific devices or structures.

It is to be understood that although the present invention has been described with reference to several embodiments, various modifications, known to those skilled in the art, may be made to the structure and process steps presented herein without departing from the invention as recited in the several claims appended hereto. For example, if an etching parameter is disclosed in a numerical range, this range is intended to include all numbers and numerical ranges assumed therein.

What is claimed is:

1. A process for fabrication of a semiconductor device, comprising the steps of:
   providing a semiconductor wafer having a topology formed thereon, said topology having a plurality of recesses;
   forming an insulating layer over said topology, said insulting layer extending into said recesses and forming bread-loafed openings in said insulating layer formed by converging surfaces of said insulting layer;
   removing a portion of said converging surfaces to remove at least a portion of a bread-loaf buildup of insulating material about said bread-loafed openings, said step of removing comprises an etch step using a gas combination of an inert gas and a chemically reactive gas that prevents dislodged insulating layer particles from re-sputtering into said gaps; and
   after said step of removing, forming a fill layer over said insulating layer to at least partially planarize said semiconductor wafer.

2. The process of claim 1, wherein said step of removing comprises using a faceting process which employs a reactive substance.

3. The process of claim 2, wherein said reactive substance comprises a gas comprising fluorine atoms.

4. The process of claim 3, wherein said gas comprising fluorine atoms is a gas selected from the group consisting of $CF_4$ and $NF_3$ gas.

5. The process of claim 2, wherein said reactive substance comprises fluorinated hydrocarbons.

6. The process of claim 1, wherein said topology comprises structures having gaps therebetween.

7. The process of claim 6, wherein said inert gas comprises argon gas.

8. A process for fabrication of a semiconductor device, comprising:
   providing a semiconductor wafer having a topology formed thereon, said topology having a plurality of recesses;
   forming an insulating layer over said topology, said insulating layer having openings extending into said recesses: and
   etching a portion of said insulating layer proximate said recesses sufficiently to effectively reduce the material about the edges of said openings of said insulating layer;
   wherein said step of etching comprises using a gas combination of an inert gas and a chemically reactive gas that prevents dislodged insulating layer particles from re-sputtering into said recesses.

9. The process of claim 8, wherein said step of etching comprises using a faceting process which employs a reactive substance.

10. The process of claim 9, wherein said reactive substance comprises a gas comprising fluorine atoms.

11. The process of claim 10, wherein said gas comprising fluorine atoms is a gas selected from the group consisting of $CF_4$ and $NF_3$ gas.

12. The process of claim 9, wherein said reactive substance comprises fluorinated hydrocarbons.

* * * * *